US008767185B2

(12) United States Patent
Sandström

(10) Patent No.: US 8,767,185 B2
(45) Date of Patent: Jul. 1, 2014

(54) CRISS-CROSS WRITING STRATEGY

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 333 days.

(21) Appl. No.: 13/314,063

(22) Filed: Dec. 7, 2011

(65) Prior Publication Data

US 2012/0307219 A1  Dec. 6, 2012

Related U.S. Application Data

(63) Continuation of application No. PCT/EP2011/072140, filed on Dec. 7, 2011.

(60) Provisional application No. 61/420,416, filed on Dec. 7, 2010, provisional application No. 61/423,503, filed on Dec. 15, 2010, provisional application No. 61/433,925, filed on Jan. 18, 2011.

(51) Int. Cl.
*G03B 27/32* (2006.01)
*G03B 27/42* (2006.01)
*G03B 27/54* (2006.01)
*G03F 7/20* (2006.01)

(52) U.S. Cl.
CPC ........ *G03F 7/70466* (2013.01); *G03F 7/70383* (2013.01); *G03F 7/704* (2013.01); *G03F 7/70583* (2013.01); *G03F 7/70358* (2013.01); *G03F 7/70425* (2013.01)
USPC ................. 355/77; 355/53; 355/67

(58) Field of Classification Search
CPC ........... G03F 7/70275; G03F 7/70291; G03F 7/70358; G03F 7/70366; G03F 7/70383; G03F 7/704; G03F 7/70425; G03F 7/70466; G03F 7/70583

USPC ................................ 355/53, 67, 77
See application file for complete search history.

(56) References Cited

U.S. PATENT DOCUMENTS

| 6,489,984 | B1 | 12/2002 | Johnson |
| 2004/0029024 | A1 | 2/2004 | Ohnuma |
| 2010/0033698 | A1* | 2/2010 | Sewell ........................... 355/53 |
| 2010/0142757 | A1 | 6/2010 | Sandstrom et al. |
| 2010/0208329 | A1 | 8/2010 | Sandstrom et al. |
| 2011/0242514 | A1 | 10/2011 | Sandstrom |

FOREIGN PATENT DOCUMENTS

WO    2010131239    11/2010

OTHER PUBLICATIONS

International Search Report and Written Opinion mailed Aug. 3, 2012 in PCT/EP2011/072140, 10pp.

* cited by examiner

*Primary Examiner* — Toan Ton
*Assistant Examiner* — Colin Kreutzer
(74) *Attorney, Agent, or Firm* — Haynes Beffel & Wolfeld LLP; Ernest J. Beffel, Jr.

(57) ABSTRACT

In general, one aspect of the technology described can be embodied in methods that include the action of applying a writing mechanism having non-isotropic writing properties resulting from different degrees of coherence interaction in a sweep direction and a cross-sweep direction, writing an image pattern twice on a work piece using the writing mechanism rotated relative to the image pattern written on the workpiece between first and second writings, whereby writing with the rotated writing mechanism averages the non-isotropic properties. The lesser included angle separating first and second relative directions of movement between a workpiece and writing mechanism may be 20 degrees or greater, or somewhat less, under conditions described herein.

13 Claims, 8 Drawing Sheets

CRISS-CROSS WRITING STRATEGY

RELATED APPLICATIONS

This application is a continuation of PCT Application PCT/EP 2011/072140, filed on 7 Dec. 2011, entitled "Criss-cross writing strategy", by Micronic Mydata AB and naming Torbjörn Sandström as inventor. This application and PCT/EP 2011/072140 both claim the benefit of U.S. Provisional Patent Application No. 61/420,416, entitled, "Criss-cross writing strategy," filed on 7 Dec. 2010; U.S. Provisional Patent Application No. 61/423,503, entitled, "Direct writing of panels", filed on 15 Dec. 2010; and U.S. Provisional Patent Application No. 61/433,925, entitled, "Alternative Direct Panel Writing Systems and Method", filed on 18 Jan. 2011. The PCT and provisional applications are incorporated by reference herein.

BACKGROUND

This specification relates to criss-cross writing of microlithographic patterns with improved isotropy of writing characteristics from a writing mechanism having non-isotropic properties resulting from different degrees of coherence in a sweep direction and a cross-sweep direction.

Increasing requirements for critical dimension precision have led to a variety of writing strategies that reduce both occasional irregularity in microlithographic patterns and periodic errors, such as snap errors and biases. One of the biases can be explained with reference to FIG. 4, which has axes labeled X and Y. This illustrates using an acousto optic deflector, rotating mirror, or other deflector to sweep interlaced writing beams parallel to the Y axis, as relative movement is created between the workpiece and writing mechanism along the X axis.

In many writing architectures there is a mismatch between the image properties in different directions. In particular this is true for scanned laser beams being modulated by acoustooptic modulators and for systems based on scanned image of a one-dimensional diffractive SLM. The reasons are the same for other types of systems. There is a first direction where the image is built sequentially by the sideways addition of linear sub-images, so that two adjacent pixels in this direction are formed at different times and do not interfere optically. In another direction, typically perpendicular to the first direction, adjacent pixels are formed more or less simultaneously. This is obviously the case with a one-dimensional SLM illuminated to have some coherence between adjacent pixels. But even in the case of a scanning laser beam modulated by an acoustooptic modulator there are transition moments from one pixel to the next one in the modulator where parts of two pixels simultaneously modulate the beam and thereby cause some amount of interference. The phenomenon is caused by the finite velocity of sound in the acoustooptic modulator and may be present in various amounts in systems using acoustooptic, holographic, rotating, oscillating, or mechanical scanning of the beams over the surface of the workpiece. The interference between adjacent pixels is normally, and if properly designed, beneficial to the image quality. If the optical system has the same NA in both directions, lines with the edges defined by pixels which interfere (i.e. lines perpendicular to the second direction) have better resolution, or if the NA in this direction is adjusted for the same resolution these lines have significantly better depth of focus. There is also a difference in iso-focal dose, i.e. the dose which gives best practical depth of focus. There is a desire to make both directions print equally good, e.g. to have isotropic iso-focal dose behavior. Since the direction with the smallest depth of focus determines the practically useful focus latitude of the system, isotropic properties which are the average between the properties in the best and worst directions give an overall more capable system.

What has been described above is non-isotropy created by a different amount of coherence in the lengthwise/beam-scanning direction versus the cross-wise direction. The difference in coherence has profound influence on the image properties, e.g. affecting the iso-focal dose. Other systems may have other sources of non-isotropy and the technology disclosed may also be useful for reducing them One effort to reduce errors is PCT application WO 2010/131239. In FIG. 11A, that reference teaches using a single direction of sweep, labeled 1010, and creating rectangular beamlets in an exemplary 2 by 3 array, with beamlets in one row being rotated +22.5 degrees and beamlets in the other row rotated −22.5 degrees, for a difference between the major axes of the two rows of rectangular beamlets of 45 degrees. The beamlets are generated from an SLM or DMD by optics that split the modulator output after modulation and rearrange the relative positions and orientations of the beamlets before they reach the workpiece, as illustrated in FIGS. 2 and 11A. In FIG. 2, the beamlets that the optics rearranges are labeled 181-184. In FIG. 11A, the rectangular beamlets that are rearranged and rotated are labeled 1000-1005 with 1000-1002 rotated +22.5 degrees and 1003-1005 rotated −22.5 degrees. The reference does not mention the problem of writing performance is bias in favor of accuracy along the so-called scan 1010 direction, with performance along the cross-scan 1011 direction being worse. To the contrary the reference teaches the use of a two-dimensional spatial modulator (DMD) which gives an image which is nearly isotropic to start with. The only non-isotropy in the partial images written by the fields in the reference comes from smearing of the pixels due to the movement, but both rotated images are smeared in the same direction. Therefore the anisotropy of the image is the same in the combined image as in the each partial image.

The so-called 1.5D SLM disclosed in a co-pending application by the same applicant is another way to reduce the non-isotropy of the image properties of a one-dimensional SLM scanned more or less sideways. The technology disclosed can be used together with the 1.5D SLM for a more complete elimination of non-isotropy.

An opportunity arises to improve pattern accuracy and reduce or eliminate bias and non-isotropy between scanning and cross-scanning directions in a microlithographic pattern. Better, more accurate systems may result.

SUMMARY

In general, one aspect of the technology described can be embodied in methods that include the action of applying a writing mechanism having non-isotropic writing properties resulting from different degrees of coherence interaction in a sweep direction and a cross-sweep direction, writing an image pattern twice on a work piece using the writing mechanism rotated relative to the image pattern written on the workpiece between first and second writings, whereby writing with the rotated writing mechanism averages the non-isotropic properties. This and other embodiments that follow can optionally include or be modified by one or more of the features described below.

DETAILED DESCRIPTION

The following detailed description is made with reference to the figures. Preferred embodiments are described to illustrate the technology disclosed, not to limit its scope, which is defined by the claims. Those of ordinary skill in the art will recognize a variety of equivalent variations on the description that follows.

It is an aspect of the technology disclosed that a writing system which has a better and a worse imaging direction is made nearly isotropic by writing twice with the optical system defining the better and worse directions being rotated relative to the pattern on the workpiece between the two writing operations (passes). The two passes can be written with the same writing hardware or with two different sets of writing hardware, and they can be written nearly concurrently in one physical stroke, or in two strokes separated in time. If they are separated in time the workpiece can be rotated between the passes or part of the optics can be rotated, e.g. a scanner defining laser beam scan lines or a one-dimensional SLM.

One of the major draw backs with current writing strategies with scanning laser beams is the inherent difference in X and Y writing performance, as measured in iso-focal dose, dose-to-size, dose sensitivity, resolution, and CD linearity. In principle, performance in X is always worse than in Y. Since more and more stringent requirement on critical dimensions requires at least double-pass printing, there is an opportunity to reduce the inherent X/Y difference. By rotating the scan a large angle, not only to compensate for the X-movement, but up to 20-45 degrees the properties in X and Y can be mixed more uniformly and the printing performance will be more isotropic.

Figure 1A:
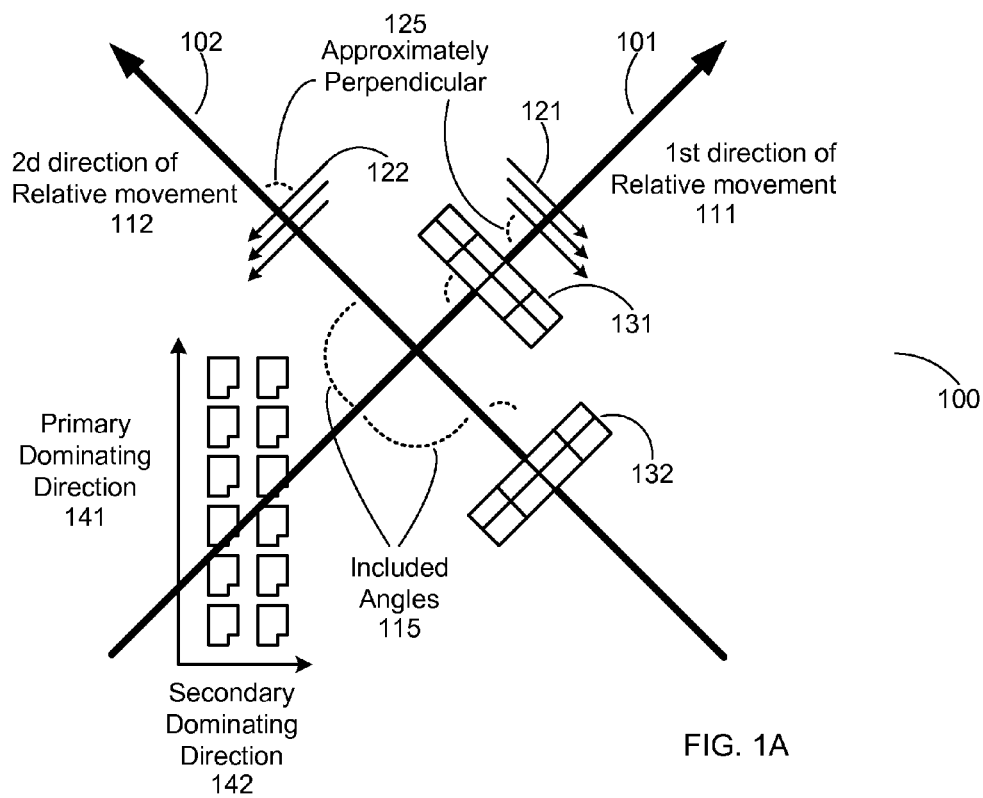
FIG. 1A illustrates an example of criss-cross writing on a stage with a writing mechanism that moves in a straight line.
Figure 2:
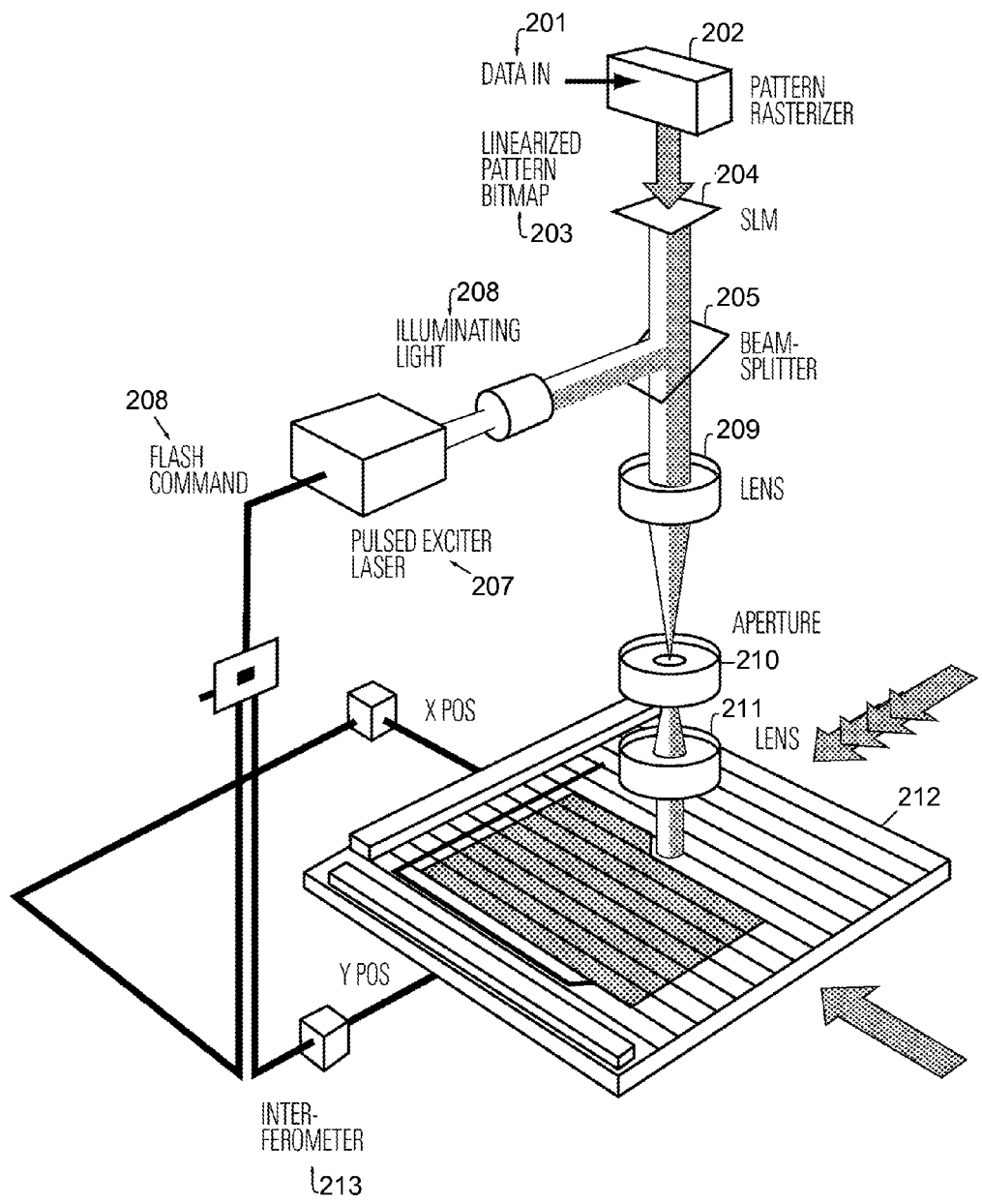
FIG. 2 illustrates a conventional SLM writer that flashes patterns from an SLM onto a workpiece.

FIG. 1A illustrates an example of criss-cross writing on a stage with a writing mechanism and writing projector that move in a straight line. This example can be applied to either a scanning beam system, such as the assignee's LRS series of mask writers or to a spatial light modulator (SLM) based system as illustrated in FIG. 2, such as assignee's LDI 5 series of systems. Stage configurations to which the approach could apply include cylinder scanning, rotor scanning, split-axis fast y scanning, split axis fast x scanning, single stroke scanning and XY stage scanning. In cylinder scanning, the workpiece is wrapped around a drum. In rotor scanning a rotor with the axis of rotation perpendicular to the flat workpiece is used to scan the surface of the workpiece at high speed. Relative movement is created by rotation of the drum combined with head movement along the axis of rotation of the drum. In split axis fast y scanning, projection elements are very densely packed in the cross-scan direction, so that interlacing is not required. Multiple projection elements may sweep across the same area in a single pass, reducing the number of passes required. Either the writing mechanism may move in both X and Y directions on arms over a stage. In split axis fast x scanning, writing elements are spaced apart and interlaced. Multiple sweeps are required for the interlaced beam to fill an area. Relative movement may be created by an arm that carries the writing mechanism relatively quickly in along one axis as a stage moves relatively slowly along a second axis. In single stroke scanning, enough writing elements are provided that the writing mechanism needs only a single sweep to fill an area, much as a copier or paper scanner works. In the XY stage, the stage moves in both X and Y directions, faster in one direction than the other. In general, FIG. 1A applies to relative movement between a workpiece and a writing mechanism when a resulting strip is projected in substantially a straight line.

In FIG. 1A, a workpiece 100 sits on a stage (not illustrated) or drum. Relative motion between the workpiece 100 and a writing mechanism is created in any of the manners described above. A first direction of relative movement 111 is indicated by arrow 101. A second direction of relative movement 112 is indicated by arrow 102. In this illustration, the azimuth angle between horizontal and the directions of relative motion is 45 degrees, so the included angles 115 between arrows 101, 102 are 90 degrees. At other large azimuth angles of relative motion, in the range of 20 to 45 degrees, the smaller of the included angles ranges from 40 to 90 degrees. A rotation angle between the two passes of 90 degrees may be optimal in many cases, giving identical pixel grids (or identical but displaced between the passes, e.g. by half a unit in x and y) for a Cartesian grid with the same grid size in x and y. A rotation angle smaller than 90 degrees gives a wider swath, i.e., the scan lines or SLM are more perpendicular to the direction of stage movement. At the same time a smaller rotation gives less good averaging between good and bad properties. On the other hand a larger rotation than 90 degrees gives both a narrower swath and less good averaging. Rotations different than 90 degrees may force or be forced into use by grids that are rectangular, oblique or hexagonal. Therefore the most useful angle is 90 degrees, but design considerations in the specific case may make rotations down to 60 degrees, and in extreme cases down to 40 degrees, needed. Likewise rotations up to about 120 degrees may be used. In all cases there may be second order considerations, such as compensation for the x speed of the stage, which command adjustments of the angles from theoretical values by +/−2 or even +/−4 degrees.

The workpiece is illustrated as being written with a so-called Manhattan pattern, a term borrowed from Manhattan's skyline. The first dominating direction 141 and second dominating direction 142 of the pattern is substantially perpendicular or orthogonal. In other patterns, additional pattern features may be laid out along 45 and 135 degree orientations, instead of horizontally and vertically. Other orientation angles occur in some types of patterns but are less common.

Two different writing projectors are illustrated, one using swept beams, as explained above, and the other projecting beamlets from a micro mechanical modulator such as an SLM. Other examples of micro mechanical modulators include DMDs, grating light valves (GLVs), liquid crystal shutters and micro mechanical shutters. The writing projector is substantially perpendicular to the direction of relative movement for both types of writers. For a writing projector that sweeps beams, the direction of sweep 121, 122 is approximately perpendicular 125 to the arrows 101, 102 that indicate the direction of relative movement 111, 112. Depending on timing, alignment and other considerations, the angle may be as much as two to three degrees off of perpendicular and still be considered approximately perpendicular. For a writing projector that uses a micro mechanical modulator, the writing projector 131, 132 is approximately perpendicular in the sense that the major axis of the modulator (or optical elements that relay radiation from the modulator) is approximately perpendicular to the arrows 101, 102. This arrangement creates a relatively wide projected strip during the relative movement. In some implementations, the micro mechanical modulator is rotated to offset sequential loading of modulator elements, as even high speed digital electronics are not instantaneous. Depending on load timing, alignment and other considerations, the angle may be as much as two to three degrees from perpendicular and still be considered approximately perpendicular.

FIG. 2 illustrates a conventional SLM writer that flashes patterns from an SLM onto a workpiece. This system has a stage capable of producing relative movement as depicted in FIG. 1A. The workpiece to be exposed sits on a stage 212. The position of the stage is controlled by precise positioning device, such as paired interferometers 213.

The workpiece may be a mask with a layer of resist or other exposure sensitive material or, for direct writing; it may be an integrated circuit with a layer of resist or other exposure sensitive material. In the first direction, the stage moves continuously. In the other direction, generally perpendicular to the first direction, the stage either moves slowly or moves in steps, so that stripes of stamps are exposed on the workpiece. In this embodiment, a flash command 208 is received at a pulsed Excimer laser source 207, which generates a laser pulse. This laser pulse may be in the deep ultraviolet (DUV) or extreme ultraviolet (EUV) spectrum range. The laser pulse is converted into an illuminating light 206 by a beam conditioner or homogenizer. Applying the technology disclosed herein, a continuous laser with the illuminator described could be substituted for the pulsed laser, especially when with the workpiece tracking optics.

A beam splitter 205 directs at least a portion of the illuminating light to an SLM 204. The pulses are brief, such as only 20 ns long, so any stage movement is frozen during the flash. The SLM 204 is responsive to the datastream 201, which is processed by a pattern rasterizer 202. In one configuration, the SLM has 2048×512 mirrors that are 16×16 µm each and have a projected image of 80×80 nm. It includes a CMOS analog memory with a micro-mechanical mirror formed half a micron above each storage node.

The electrostatic forces between the storage nodes and the mirrors actuate the mirrors. The device works in diffraction mode, not specular reflectance, and needs to deflect the mirrors by only a quarter of the wavelength (62 nm at 248 nm) to go from the fully on-state to the fully off-state. To create a fine address grid the mirrors are driven to on, off and 63 intermediate values. The pattern is stitched together from millions of images of the SLM chip. Flashing and stitching proceed at a rate of 1000 stamps per second. To eliminate stitching and other errors, the pattern is written four times with offset grids and fields. Furthermore, the fields may be blended along the edges.

The mirrors are individually calibrated. A CCD camera, sensitive to the Excimer light, is placed in the optical path in a position equivalent to the image under the final lens. The SLM mirrors are driven through a sequence of known voltages and the response is measured by the camera. A calibration function is determined for each mirror, to be used for real-time correction of the grey-scale data during writing. In the data path, the vector format pattern is rasterized into grey-scale images, with grey levels corresponding to dose levels on the individual pixels in the four writing passes. This image can then be processed using image processing. The final step is to convert the image to drive voltages for the SLM. The image processing functions are done in real time using programmable logic. Through various steps that have been disclosed in the related patent applications, rasterizer pattern data is converted into values 203 that are used to drive the SLM 204.

Figure 1B:
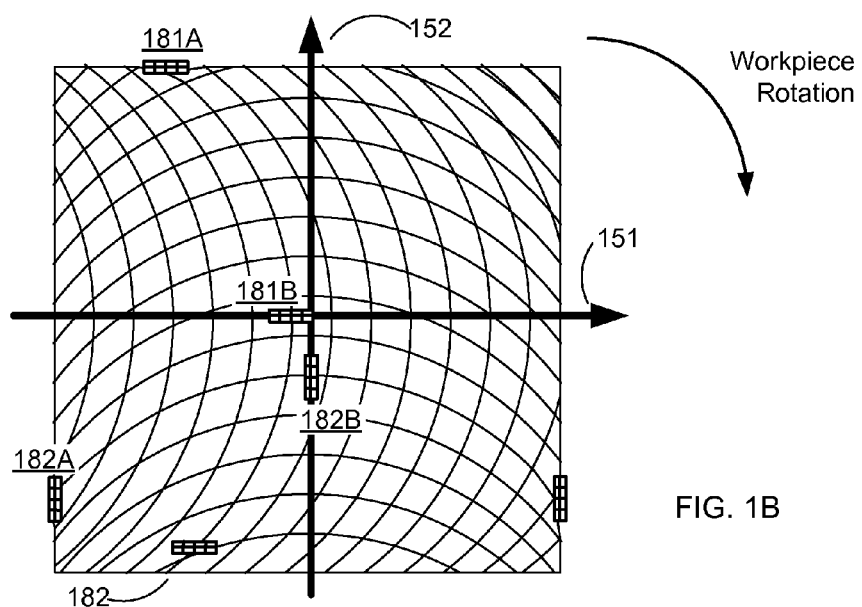
FIG. 1B illustrates an example of criss-cross writing on a stage with a writing mechanism that sweeps an arc.

FIG. 1B illustrates an example of criss-cross writing on a stage with a writing mechanism that sweeps an arc using a writing projector that rotates as the writing mechanism rotates. The first direction of relative movement of a stage under the writing mechanism is indicated by arrow 151. The sweep of the writing projector is roughly along the arc 182 described by a rotating writing arm. A mirror of the writing projector is mounted on an arm with a projection axis parallel to the arm and is approximately perpendicular to the arc 182 swept by the writing projector, projecting a relatively wide strip during the sweep. Due to the design of the optics in the rotor, the projected image may remain largely unrotated as the writing mirror rotates and sweeps an arc. Depending on alignment, off-axis optics and other considerations, approximately perpendicular are within two to three degrees of being perpendicular. When the writing projector sweeps an arc, the motion of the writing projector is along a different path than the relative motion of the workpiece and overall writing mechanism.

The figure further indicates rotation of the workpiece, so that the relative motion between the workpiece and the writing mechanism becomes aligned with arrow 152. The directions of relative movement 151, 152 are perpendicular. While the crossing pattern of arcs swept on the workpiece varies across the area patterned, comparing the projected writing images 181A-B with 182A-B, it is apparent that the projected writing images in first and second writing passes are substantially perpendicular.

Figure 7:
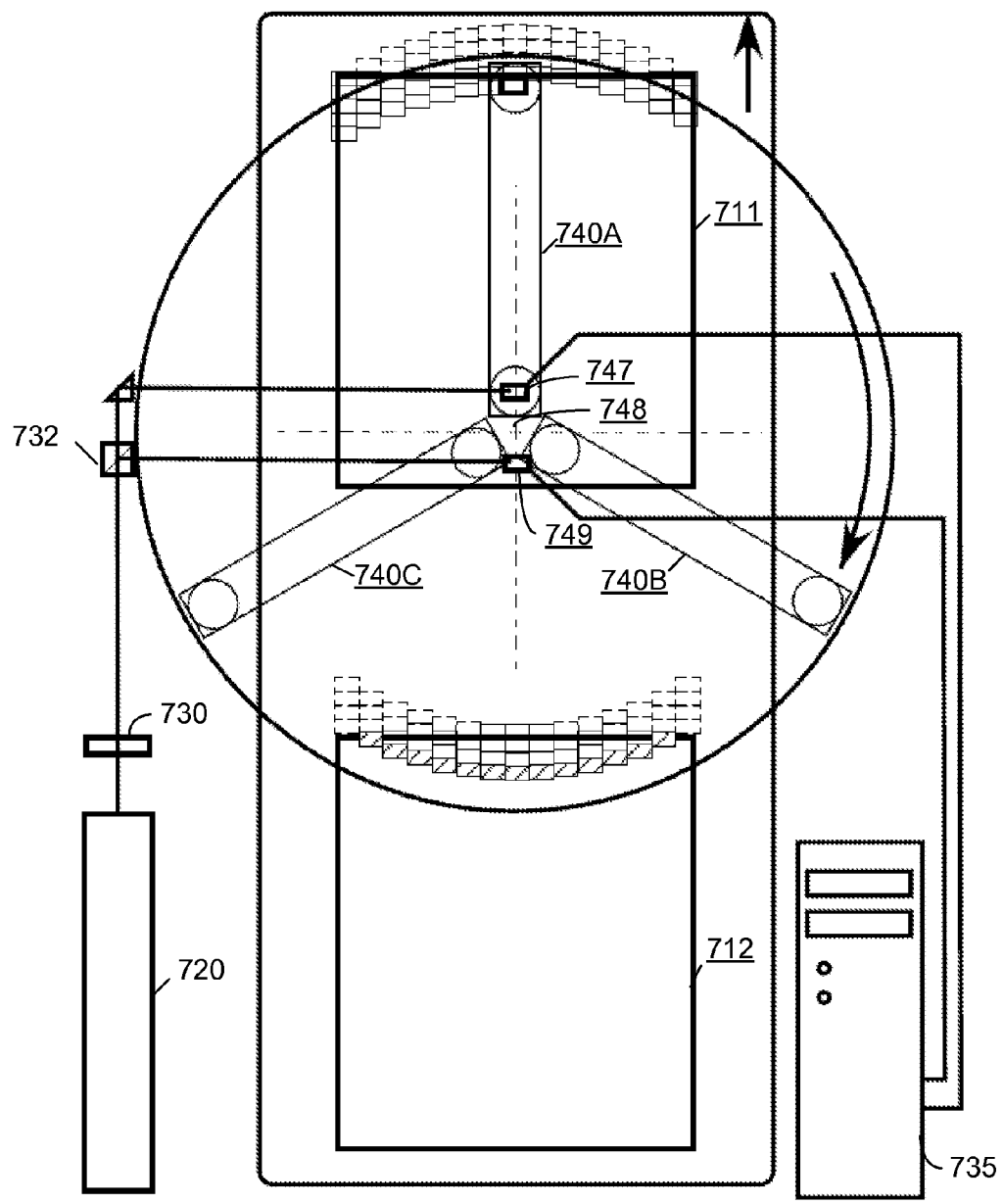
FIG. 7 illustrates a rotating arm writer capable of projecting modulated radiation onto a workpiece.

FIG. 7 illustrates a rotating arm writer capable of projecting modulated radiation onto a workpiece with the relative movement depicted by FIG. 1B. This figure depicts a rotor scanning system with three arms and a pair of workpieces 711, 712 being written on opposite sides of the hub 748. A rotary printer as depicted may print 2D images on the workpiece. This system may have a duty cycle of 100%. Each rotor writes through an arc of 60 degrees. Only one arm 740 writes at a time, alternatively on the two workpieces 711 and 712. The laser energy is switched by polarization control 732 between the two SLMs 747 and 749, and the data stream is also switched between the SLMs. Since the laser 720 and the data path 735 are among the most expensive modules in writing machines, this embodiment has been designed to use laser and data channel 100% of the time while the SLMs and the optics in the arms have lower duty cycles, 50% and 33% respectively. This may be, for instance, an example of a writing system with three rotating arms 740A-C. There are a variety of alternative designs for these arms and the relay optics. The figure conceptually depicts a laser 720 and a controller 735 sending data to two SLMs 730 which produce patterns that are relayed 732, 747, 749 to the rotating arms. It shows how each arm moves in front of each SLM and writes a series of concentric stamps on the workpieces 711, 712. While two workpieces are shown in this figure, more workpieces could be positioned under a rotor, depending on its size. While the example is described as a writing system, the direction of relay could just as easily be from the workpiece back to a pair of detectors positioned where the laser 720 is and elsewhere. In alternative configurations, one workpiece might be used or e.g. four arms might be used. More details regarding the rotating arm writer may be found in e.g. U.S. 2010/0142757 or other patent applications by the applicant.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

This rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is a micromechanical 1D SLM with constant 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical 1D SLM, effectively having 8000×1 pixels, each stroke would fill a stripe 40 mm wide with pattern, and cover—with some reduction for the non-straight scan –0.3 square meters per second or 20 square meters per minute. This is a very high coverage rate, compared to other writing technologies.

The method disclosed may be implemented in a rotor system or non-rotating system using one or a plurality of SLMs that the applicant refers to as a 1.5D SLM. More details regarding this SLM may be found in U.S. 2011/0242514 A1. A conventional 1D SLM may have N×1 pixels and a conventional 2D SLM may have 2000×500 or 1024×768 pixels. The applicant calls a device a 1.5D SLM with N×M pixels, where N is a large number such as 1024, 2048, 4096, 8192 or 16384 and M is a much smaller number, less than or equal to 20, for instance 2, 3, 4, 5, 6, 8, 10, 15 or 20 pixels.

By pixel we mean an area of the 1.5D SLM which is treated in the datapath as one unit and which is assigned a pixel value. In some cases a pixel may be a single micro mirror, in others a pixel may be a collection of mirrors controlled by the same pixel value. There are many small mirrors and clusters of them form pixels. For diffractive operation, the mirrors can be controlled in an analog fashion, i.e. they can be set to one of many states as dictated by the pixel value. Another important aspect is that they work by diffraction, i.e. by controlling the phase of the light and indirectly modulate the intensity of the pixel by interference within and between mirrors. Given that the mirrors are made accurate enough to interfere with each other in a predictable way multiple mirrors can be used as one pixel and still form a single diffraction limited spot on the workpiece.

The mirrors within one pixel of the 1.5D SLM are controlled by the same pixel value. However, the mirrors need not be controlled identically, e.g. some mirrors may tilt left and others tilt right. The device is illuminated by a laser beam which is essentially coherent over an area which spans a few pixels in the long (horizontal) direction of the 1.5D SLM and the entire device width in the short direction.

The 1.5D SLM, unlike the prior art, is preferably illuminated by partially coherent light in the long direction and by a coherent light distribution in the short direction, with coherence that spans over more than one pixel. In particular, the coherence may span the entire device (or the illuminated part of it) in the short direction. Alternatively, the illumination in the short direction may consist of a small number of coherent but mutually incoherent light distributions, each spanning over more than one pixel or the entire width of the device.

Use of the 1.5D SLM helps resolve different properties in the short and long direction, which the 1D SLM suffers. The 1D SLM is attractive to systems designer, because it can be illuminated with a continuous laser or a pulsed laser that operates at a frequency which is at least as high as the number of pixel scanned over per time unit and sometimes in the tens or hundreds megahertz range. The 1D SLM uses the optical field efficiently and it can be swept either perpendicular to the array or at an angle. It can be swept along a straight line or a curvilinear path.

To explain how the 1.5D SLM alleviates non-isotropy in the image, it is useful to consider imaging theory. In the long direction, the SLM is illuminated by partially coherent light. Partial coherence means that the electric fields in two points are correlated if the points are close to each other and not correlated if the points are separated by some distance. The magnitude of the correlation is a function of the separation distance. The magnitude is called the coherence function. The coherence function is determined by the angular distribution of the light illuminating the SLM by the Van Cittert-Zernike theorem in coherence theory. It is not uncommon in lithography that the area over which there is high coherence is chosen to be three to four pixels across. Once the coherence function is known, the image properties can be calculated or simulated using commercial software. One way to calculate the image is to divide the light source into a cloud of mutually incoherent source points, calculate the image produced by the light from each source point, and sum up all the images.

To calculate the image from a 1D SLM in the scanning direction one calculates the image assuming coherence for each position during scanning and sums up all images. There is no interference between neighboring pixels, because there is only one pixel involved in each image. Images of different pixels are printed at different points in time.

For the 1.5D SLM, the illumination is still coherent in the short direction, but two or more pixels are used for each image and they may interfere with each other. The next image is calculated with the workpiece moved by one pixel unit and the data loaded into the SLM is modified accordingly. The image is the sum of the images produced while the image line is scanned across. Somewhat surprisingly this gives an image with the similar properties as the one produced by the partially coherent illumination in the long direction. The intensity profile of the illumination across the SLM has the function of the coherence function in the long direction. To get small asymmetry the illuminated area in the short direction should be approximately the same size as the size of the coherence function in the long direction. The image is easily calculated as a sum of coherent images and the illumination profile may be modified, e.g. with filters in a Fourier plane, to fine-tune the image properties.

The method disclosed may also be implemented in a rotor system or non-rotating scanning system using one or a plurality of one-dimensional SLMs in combination with anamorphic optics, which we contrast to 1.5D optics. More details regarding this configuration is found in U.S. 2010/0208329 A1. A light source (arc lamp, gas discharge, laser, array of lasers, laser plasma, LED, array of LEDs etc.) may be used to illuminate the at least one one-dimensional SLM. The reflected (or transmitted in the general case) radiation is projected as a line segment on a workpiece. The data driving the SLM changes as the workpiece is scanned to build up an exposed image. A strongly anamorphic optical system concentrates energy from multiple mirrors in a column (or row) to point in the image and the entire two-dimensional illuminated array forms a narrow line segment that is swept across the workpiece. In one dimension, the anamorphic optics demagnify the illuminated area, for instance, by 2× to 5×, so the SLM, e.g. an approximately 60 millimeter wide SLM, would image onto a line segment 30 to 12 mm long. Along the short dimension of the SLM, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lens system.

The anamorphic optics can be designed in a number of ways. One design projects an image from the at least one SLM to the workpiece with a large difference in magnification (typically demagnification) between the two axis directions of the SLM. This is optically difficult to design and make, and more difficult the larger the difference in magnification in the two axis directions. Such a system would position the focus for both of the two axes directions at the SLM surface, but the demagnification in the first direction would be so high that the two-dimensional illuminated area on the SLM collapses to one line, i.e. all illuminated points in the first direction of the SLM fall within one resolved spot in the second direction in the image. Another way to describe the optics is that it forms an image which resolves mirrors in one direction but not in the other direction. The resolution in the image plane is approximately the same between the two axis directions, but in the SLM plane there is a large resolution difference, so that the resolved spot in the first axis direction is typically 1.5-2 mirrors and in the second axis direction it is larger than the illuminated area.

In contrast, the at least one 1.5D SLM described above would be used in combination with less anamorphic optics. In one implementation, in which micro mirrors have a projected width along the long axis of 10 microns each, five rows of micro mirrors might have a projected height along the narrow access of 50 microns, making the projected mirrors on the image plane essentially square, meaning that the two dimensions of a pixel in the image is essentially equal, or in the range 1:2 to 2:1. With this more limited demagnification, individual gangs of mirrors functioning as a single pixel would be projected to distinct, if overlapping locations. Thus, interference and diffraction effects along the narrow axis would produce coherent effects. That is, overlapping projections from adjoining mirrors with matching phases would have additive amplitudes. Overlapping projections with opposed phases would have subtractive amplitudes.

Figure 3:
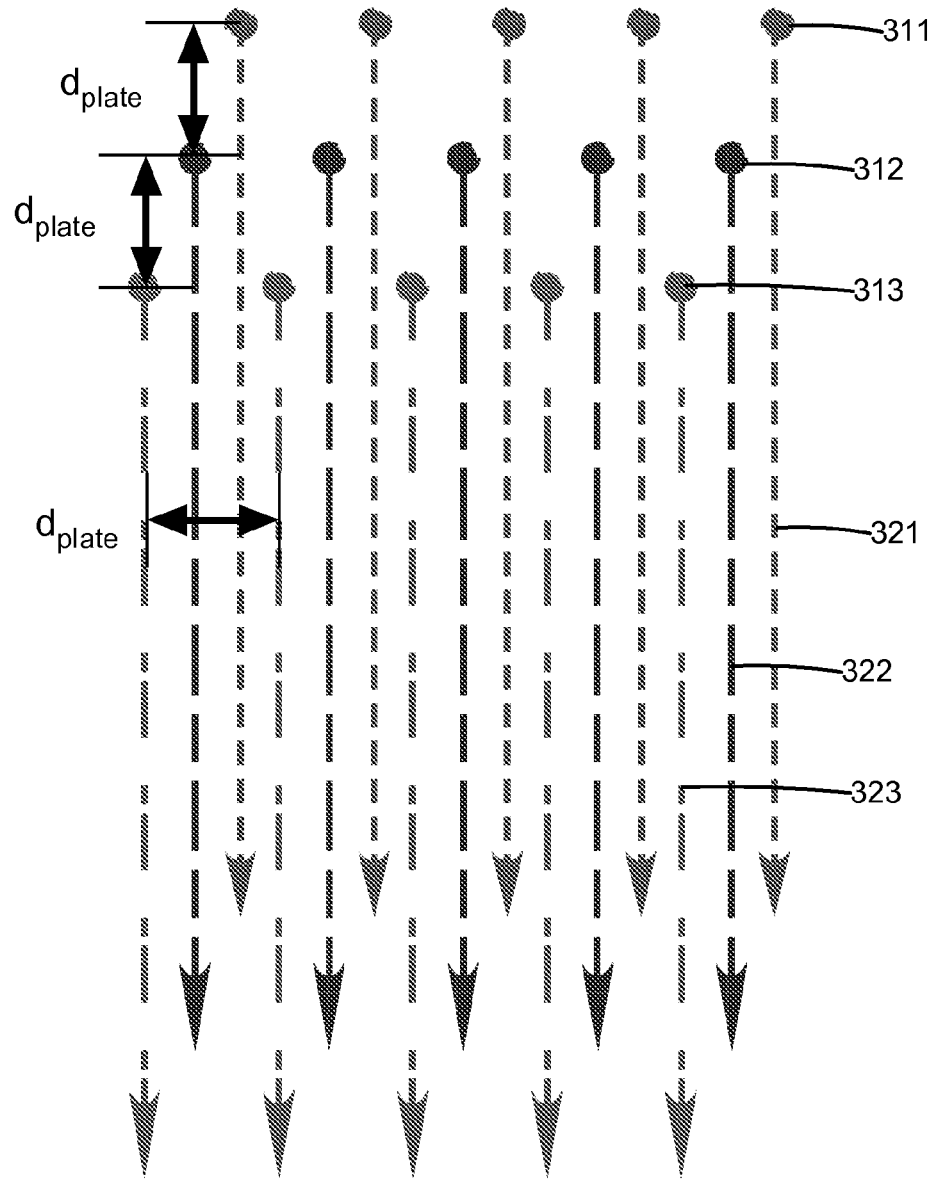
FIG. 3 illustrates conventional interlacing of scanned beams.

FIG. 3 illustrates conventional interlacing of scanned beams. Fifteen beams are depicted in the figure, in rows 311, 312 and 313. The beams scan 321, 322, 323 in a direction approximately perpendicular to the row alignment illustrated. The beams are spaced apart in both horizontal and vertical directions by a distance labeled d-plate, to reduce beam separation in the cross-scan horizontal direction without causing interference between adjoining beams. This permits use of coherent and partially coherent sources along with relatively tight spacing in the cross-scan direction.

Figure 4:
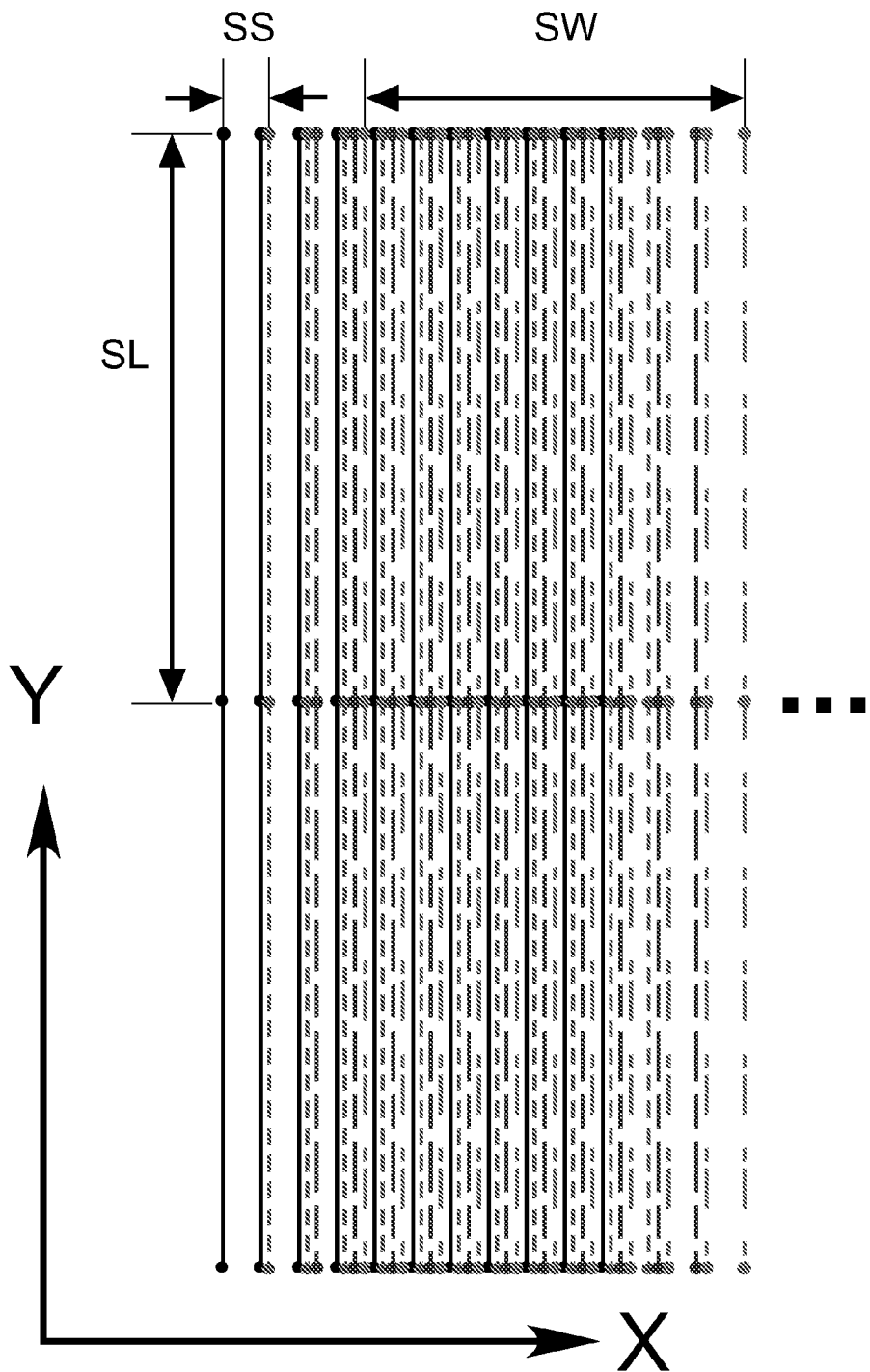
FIG. 4 illustrates conventional non-rotated scanning, in which an acousto optic deflector, rotating mirror, or other deflector scans interlaced writing beams parallel to the Y axis, as relative movement is created between the workpiece and writing mechanism along the X axis.
Figure 5:
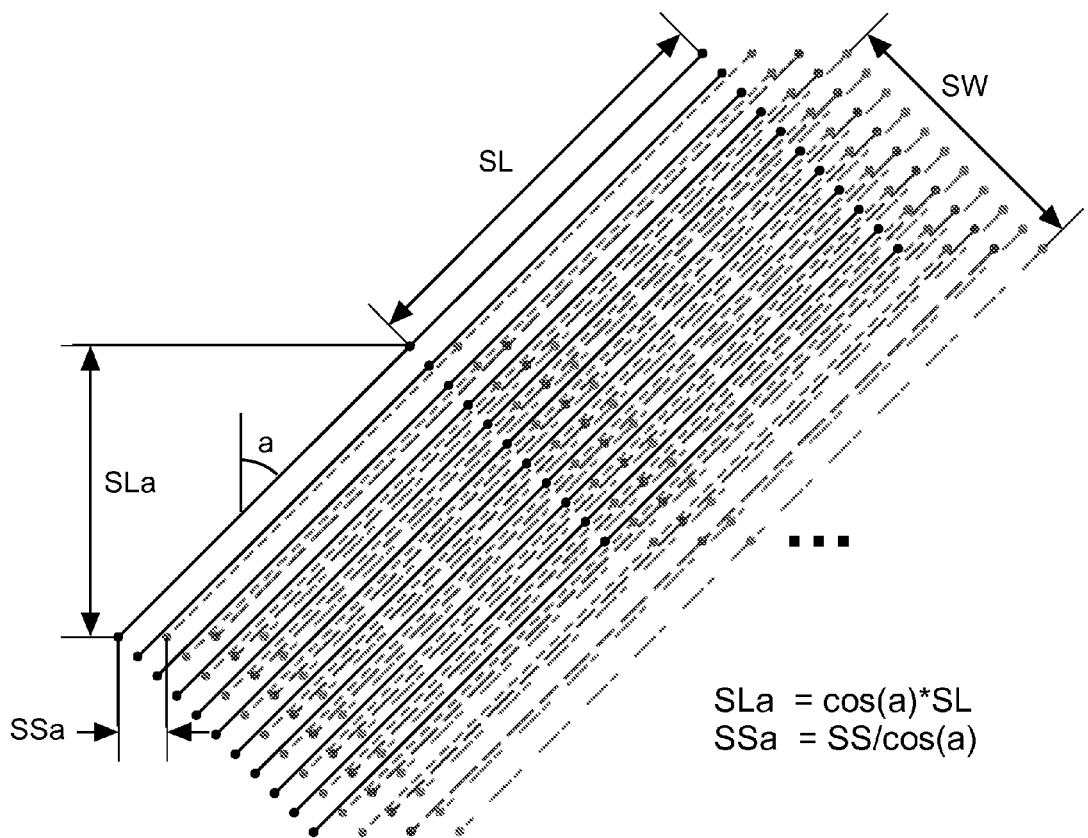
FIG. 5 illustrates an example of innovative rotated scanning

FIGS. 4-5 contrast conventional interlaced scanning of beams with rotated scanning. Both examples show how 4 consecutive scans are interlaced and lined up with the next scan stripe. In the FIG. 4 non-rotated scan, SL is the scan length and also the stripe width, SW the total width of the scan including all beams, and SS is the distance in X between two scans.

FIG. 4 illustrates conventional non-rotated scanning, in which an acousto optic deflector, rotating mirror, or other deflector scan interlaced writing beams parallel to the Y axis, as relative movement is created between the workpiece and writing mechanism along the X axis. Beams are spaced apart by a distance labeled SS. An array of spatially separated beams spans a width labeled SW. The scanning mechanism scans a beam a distance labeled SL. In this rectangular, non-rotated scan, the area swept can be calculated to equal SW*SL.

FIG. 5 illustrates an example of innovative rotated scanning. In this example illustration, the angle labeled "a" is approximately 45 degrees. Other angles in the range of 20 to 45 degrees may be used. Alternatively, an angle in the range of 20-30 degrees may be used, which may be useful for patterns that include patterns laid out along 0, 45, 90 and 135 degree orientations. Most generally, angles rotated 5 degrees or more and angles 10 degrees or more from the closest dominating direction in the pattern can be useful for rotated scanning.

Comparing the figures shows the area covered by each scan is the same irrespectively if the scan is rotated or not, i.e. the writing speed without overhead such as acceleration and retardation is the same. However, the effective scan length (SLa) will shrink in the rotated case, thereby increasing the number of scan stripes with a factor of 1/cos(a). In addition, the exposure velocity will increase with the same factor since the distance in X between two scans increases with a rotated scan (SSa). The result is a slight reduction in throughput of a couple of percent.

FIG. 5 further illustrates how the rotated scan distributes strip overlaps over a much larger area. In the non-rotated case the overlap area is located along one Y-coordinate, whereas in the rotated case it is distributed both in X and Y. Oblique writing will make all beams contribute to all edges and the phase of the edge roughness is randomized for each feature in a repeating pattern. The result is likely to result in a significant reduction in certain types of mura, in particular "mathematical" and "dirt" mura. Other types of mura are likely to be reduced as well.

Figure 6:
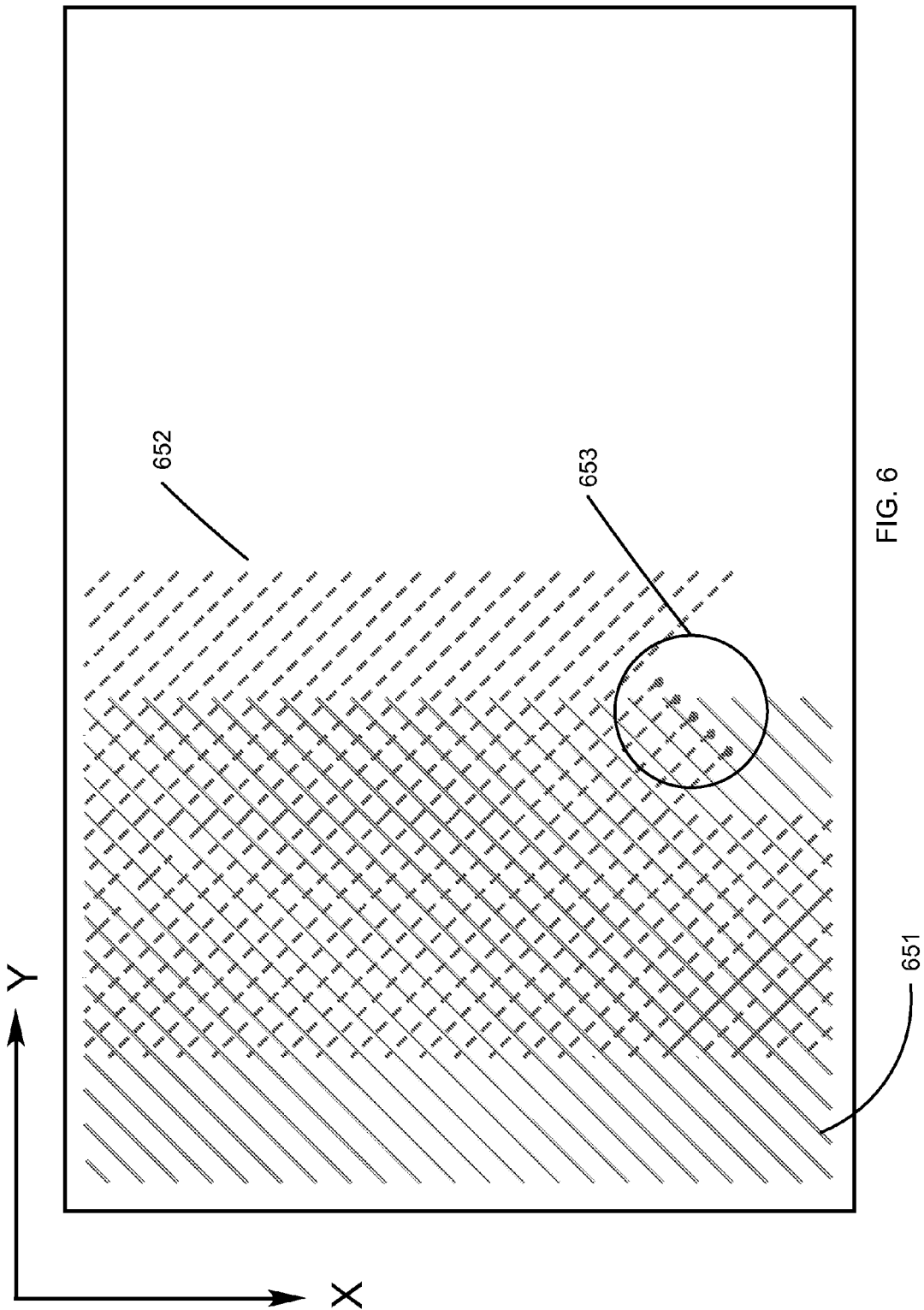
FIG. 6 illustrates a pattern of cross-cross scanning.

FIG. 6 illustrates a pattern of cross-cross scanning Strips rising from left to right 651 are approximately perpendicular to strips falling from left to right 652. While the strips are indicated as starting in a single line 653, they can be staggered as illustrated in FIGS. 3 and 6 to increase density in the cross-scan direction.

Figure 8A:
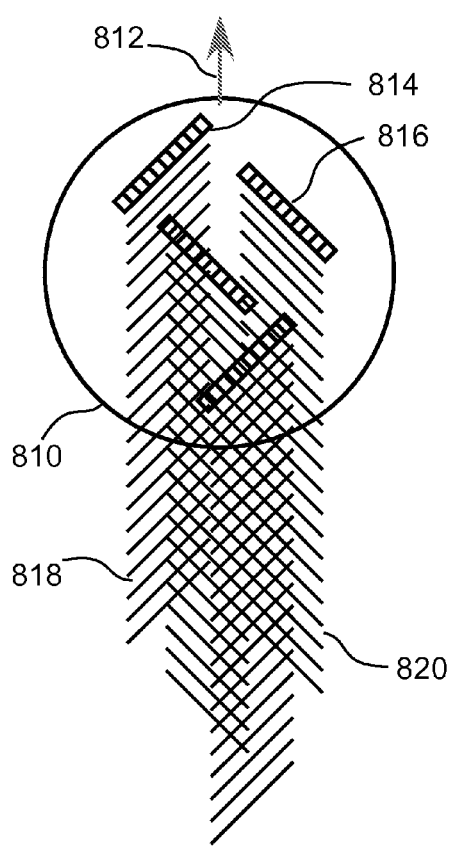
FIG. 8 shows two embodiments of the technology disclosed that provide simultaneous writing of the two passes.

FIG. 8 shows two embodiments of the technology disclosed with simultaneous writing of the two passes. FIG. 8A shows an embodiment where the images 814, 816 from several one-dimensional (or 1.5D) SLMs are placed in the same optical field 810, e.g. the field from a single lens system. When the field moves 812 across the surface of the workpiece each SLM writes one swath 818, 820. The swath 814 from an SLM tilted to the left writes a swath 816 with the high-coherence direction in the direction 1:30/7:30 on the clock. The opposite tilted SLM 816 writes a swath or stripe with the high coherence in the direction 10:30/4:30. As the picture shows the swathes overlap after the writing and each point in the image is written with high coherence in the directions 1:30, 4:30, 7:30, and 10:30 and with low coherence in the same directions. Therefore the optical properties of the image, e.g. iso-focal dose and depth of focus are nearly isotropic. The technology disclosed can be generalized to more passes and more angles if desired.

Figure 8B:
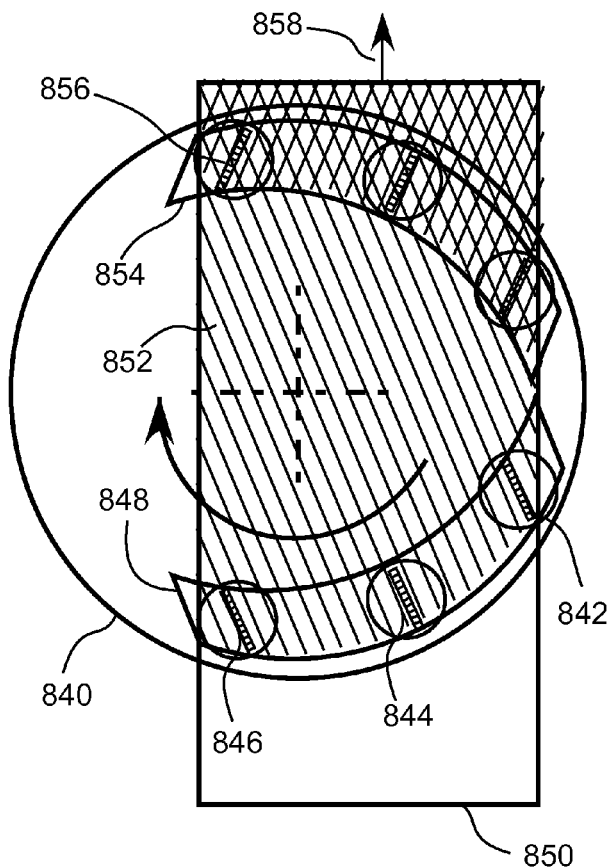

FIG. 8B shows a rotor scanner configured to write both passes in one physical pass of the workpiece 850 through the system. This gives higher throughput and less overhead time than the alternative embodiment where the workpiece is rotated. The rotor 850 has two arms 856 and 842 with oppositely rotated SLM images. When the rotor turns the images of the SLMs moves over the surface of the workpiece. In the example embodiment the SLM image 842 translates but does not rotate during the movement through a range of locations e.g. 844 and 846. Therefore the SLM images draw curved stripes or swaths 848 and 854. The workpiece 850 is stepwise or continuously moved 856 and additional stripes are written so that the area of the workpiece is fully written 858. After the workpiece has passed the rotor it has been written twice with different rotations of the SLM images and a reduction of the non-isotropy in the image results. In the example embodiment the angle between the SLM images is non-perpendicular and the center of the rotor is offset from the center of the workpiece. The offsetting of the rotor solves the problem of varying swath width when the SLM image is not parallel to the direction of movement of the workpiece 858. The angle between the direction 858 and the images of the SLMs 856, 842 is less than 45 degrees. This gives less perfect isotropy in the image, but higher throughput since the width of the swaths can be maintained nearly constant for different angles. Using 45 degrees would give better optical isotropy, but less efficient use for the SLM since the swaths would be narrower in one end because the direction of the SLM would be more parallel to the direction of translation of the field. The embodiment can be designed with only two arms or with a larger number of arms, e.g. 4, 6, or 8. FIG. 8B has been described with the field 856 and 842 not being separated by 180 degrees. This is merely for illustrative purposes. The fields may be positioned as 856 and 844 or with other angles between them.

The data may or may not be identical between the at least two writings, or passes. The grids may be displaced and/or the stripes may be shifted. The rasterization of the pattern in each pass may be made with awareness on how the pass is going to be written. Pass-aware rasterization may improve quality and reduce artefacts compared to identical data in each pass.

The method according to the invention may further include the action of rasterizing pattern data for one, a plurality of, or each of the at least two writings, or writing passes, by e.g. adapting pattern data to a certain writing strategy or pass and/or with awareness about the sub-pattern associated with that particular writing pass and/or rasterizing sub-pattern data associated with one writing pass being aware of how the final image pattern should appear on the workpiece, e.g. edges and/or features of the final image pattern produced by the at least two writings, or writing passes.

Some Particular Embodiments

The technology described can be embodied in methods that include the action of applying a writing mechanism having non-isotropic properties resulting from different degrees of coherence in a sweep direction and a cross-sweep direction, writing an image pattern twice on a work piece using the writing mechanism rotated relative to the image pattern written on the workpiece between first and second writings, whereby writing with the rotated writing mechanism averages the non-isotropic properties.

This and other embodiments that follow can optionally include or be modified by one or more of the features described below.

One aspect of the technology described can be embodied in methods that include the action writing on a workpiece using scanned radiant energy beams in at least first and second writing passes, wherein the first and second writing passes oriented with laser sweep directions of the first and second writing passes that are substantially orthogonal. This and other embodiments that follow can optionally include or be modified by one or more of the features described below.

Another example is a method of writing a microlithographic pattern onto a workpiece, including creating first relative movement between a workpiece and a writing mechanism in a first direction relative to the workpiece; writing a first pass of the microlithographic pattern during the first relative movement with a writing projector oriented at a first angle approximately perpendicular to relative motion of the writing projector and the workpiece; creating second relative movement between the workpiece and the writing mechanism in a second direction relative to the workpiece; and writing a second pass of the microlithographic pattern during the second relative movement with a writing projector oriented at a second angle approximately perpendicular to relative motion of the writing projector and the workpiece; wherein the first and second directions define a minimum included angle of at least 20 degrees. Alternatively, instead of the writing projector being oriented perpendicular to relative motion of the workpiece and writing projector, the projected image (181A-B, 182A-B) may be oriented perpendicular to the relative motion of the workpiece and writing mechanism.

Optionally, neither the first direction nor the second direction is parallel or perpendicular to a primary dominating direction in a microlithographic pattern formed during the first and second passes.

Optionally, the first direction and the second directions are approximately perpendicular.

Optionally, the first direction and the relative motion of the writing projector and the workpiece during the first writing pass are parallel.

Optionally, wherein the writing projector scans energy beams during the first writing pass in a direction approximately perpendicular to the first direction.

Optionally, the methods further include using an SLM in the writing mechanism; further including using a laser beam scanner in as the writing projector; and/or using a plurality of laser beams in the writing mechanism.

Optionally, the first direction is approximately 45 degrees to a primary dominating direction in a microlithographic pattern formed during the first and second passes, within a margin +/−2 degrees and the second direction is approximately 90 degrees to the first direction, within a margin of +/−4 degrees.

Optionally, the first direction is between 25 and 65 degrees to a primary dominating direction in a microlithographic pattern formed during the first and second passes, and the second direction is approximately reflected across a parallel or perpendicular to the primary line orientation.

Optionally, the methods further include writing each pass with multiple radiant energy beams; staggering starting and ending points, relative to the workpiece, of some of the multiple radiant energy beams, so that a maximum radiant energy delivered varies across the workpiece and is less at the edges of a strip than in the middle of the strip; and writing overlapped strips of adjoining writing sweeps and taking into account the staggering of the multiple radiant energy beams when modulating the multiple radiant energy beams in overlapped areas of adjoining strips.

The invention claimed is:

1. A method of writing a microlithographic pattern onto a workpiece, including:
   applying a writing mechanism having non-isotropic writing properties resulting from different degrees of coherence interaction in a sweep direction and a cross-sweep direction,
   writing image pattern twice on a work piece, with the writing mechanism rotated relative to the image pattern written on the workpiece between first and second writings,
   whereby writing with the rotated writing mechanism averages the non-isotropic properties.

2. The method of claim 1, wherein the rotation of the writing mechanism relative to the pattern between the two writings is in the range 40-120 degrees.

3. The method of claim 1, wherein the rotation of the writing mechanism relative to the direction of movement of the writing mechanism between the two writings is in the range 40-120 degrees.

4. The method of claim 1, wherein the first and second writings proceed in first and second directions and neither the first direction nor the second direction is parallel or perpendicular to a primary dominating direction in a microlithographic pattern formed during the first and second writings.

5. The method of claim 1, wherein the first and second writings proceed in first and second directions and the first direction and the second directions are approximately perpendicular.

6. The method of claim 1, further including using an SLM in the writing mechanism.

7. The method of claim 1, wherein a writing projector scans energy beams during the first writing in a direction approximately perpendicular to a first direction of relative motion between the writing projector and the workpiece.

8. The method of claim 7, further including using a laser beam scanner in the writing mechanism.

9. The method of claim 1, further including using a plurality of laser beams in the writing mechanism.

10. The method of claim 1, wherein the first and second writings proceed in first and second directions and the first direction is approximately 45 degrees to a primary dominating direction in a microlithographic pattern formed during the first and second writings, within a margin +/−2 degrees and the second direction is approximately 90 degrees to the first direction, within a margin of +/−4 degrees.

11. The method of claim 1, wherein the first and second writings proceed in first and second directions and the first direction is between 25 and 65 degrees to a primary dominating direction in a microlithographic pattern formed during the first and second writings, and the second direction is approximately reflected across a parallel or perpendicular to the primary line orientation.

12. The method of claim 1, further including:
   writing each writing pass with multiple radiant energy beams;
   staggering starting and ending points, relative to the workpiece, of some of the multiple radiant energy beams, so that a maximum radiant energy delivered varies across the workpiece and is less at the edges of a strip than in the middle of the strip; and
   writing overlapped strips of adjoining writing sweeps and taking into account the staggering of the multiple radiant energy beams when modulating the multiple radiant energy beams in overlapped areas of adjoining strips.

13. A micro-lithographic writing system including scan control hardware and software that writes onto a workpiece using the method of claim 1.

* * * * *